(12) United States Patent
Brendel

(10) Patent No.: US 9,835,656 B2
(45) Date of Patent: Dec. 5, 2017

(54) METHOD AND DEVICE FOR MEASURING CURRENT AT A CONVERTER

(71) Applicant: DR. JOHANNES HEIDENHAIN GMBH, Traunreut (DE)

(72) Inventor: Christian Brendel, Traunreut (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 317 days.

(21) Appl. No.: 14/328,253

(22) Filed: Jul. 10, 2014

(65) Prior Publication Data

US 2015/0015235 A1  Jan. 15, 2015

(30) Foreign Application Priority Data

Jul. 10, 2013 (DE) .................. 10 2013 213 508

(51) Int. Cl.
*G01R 19/00* (2006.01)
*G01R 35/00* (2006.01)

(52) U.S. Cl.
CPC ........ *G01R 19/0092* (2013.01); *G01R 35/005* (2013.01)

(58) Field of Classification Search
None
See application file for complete search history.

(56) References Cited

U.S. PATENT DOCUMENTS

| 7,242,177 B2 | 7/2007 | Maier et al. |
| 2004/0027083 A1 | 2/2004 | Suzuki |
| 2006/0181289 A1 | 8/2006 | Deboy et al. |
| 2013/0181652 A1 | 7/2013 | Blanc et al. |
| 2015/0061392 A1* | 3/2015 | Berard ............... G01R 31/42 307/52 |

FOREIGN PATENT DOCUMENTS

| DE | 102 37 920 | 2/2004 |
| DE | 102 40 243 | 3/2004 |
| EP | 2 607 914 | 6/2013 |
| JP | 2005-160136 | 6/2005 |
| WO | 2010/045965 | 4/2010 |
| WO | 2012/028390 | 3/2012 |

OTHER PUBLICATIONS

Eiji JP 2005160136 "Inverter Device and Automobile Equipped with it" (English Machine Translation) Published Jun. 16, 2005.*
European Search Report, dated Oct. 22, 2014, issued in corresponding European Patent Application No. 14166947.3.

* cited by examiner

*Primary Examiner* — Melissa Koval
*Assistant Examiner* — Felicia Farrow
(74) *Attorney, Agent, or Firm* — Andrews Kurth Kenyon LLP

(57) ABSTRACT

In a method and device for measuring current at a converter, the prevailing phase current is determined at the output of the converter by current-measuring devices, in order to supply it to a closed-loop control device assigned to the converter. The prevailing phase current to be ascertained at an output of the converter is measured independently at two current-measuring devices, and the measuring results of both current-measuring devices are utilized to determine the prevailing phase current.

14 Claims, 3 Drawing Sheets

METHOD AND DEVICE FOR MEASURING CURRENT AT A CONVERTER

CROSS-REFERENCE TO RELATED APPLICATIONS

The present application claims priority to Application No. 10 2013 213 508.4, filed in the Federal Republic of Germany on Jul. 10, 2013, which is expressly incorporated herein in its entirety by reference thereto.

FIELD OF THE INVENTION

The present invention relates to a method for measuring current at a converter, and to a device provided for that purpose. For example, a prevailing phase current is measured at the outputs of the converter by current-measuring devices, in order to be able to supply it to an open-loop or closed-loop control device assigned to the converter.

BACKGROUND INFORMATION

For example, an electric motor is able to be operated via a converter at whose outputs the phase currents are to be measured, the electric motor being driven such that a specific predefined setpoint position is reached by a machine tool or other industrial installations assigned to the electric motor. To that end, the electric motor must be supplied with current (at each of its phases) such that the supply current corresponds to the setpoint current necessary to reach the setpoint position. This, in turn, requires a highly accurate measurement of the individual phase currents at the outputs of the converter via which the electric motor is operated, in order to be able to adjust the phase currents so that their actual values correspond to the respective setpoint value of the phase current.

For a detailed discussion of this problem, reference is made to PCT International Published Patent Application No. WO 2012/028390, in which on this matter, a specific interaction is described between a device for measuring the phase currents of an electric motor and further components of the control circuit of an electric motor.

SUMMARY

Example embodiments of the present invention facilitate a highly accurate measurement of current at the outputs of a converter in a simple manner.

According to example embodiments of the present invention, the prevailing phase current to be ascertained at an output of the converter is measured independently at at least two, especially exactly two, current-measuring devices which, in particular, are connected in parallel to each other, the measuring results of both (all) current-measuring devices being utilized to determine the prevailing phase current. For example, this may be accomplished by averaging (possibly with weighting] the measured values of the phase current obtained at the current-measuring devices.

By determining the phase currents on the basis of the measured values of (at least) two current-measuring devices, particularly by averaging the measured values obtained at the current-measuring devices for the prevailing phase current, the signal-to-noise ratio of the results for the prevailing phase current resulting from the averaging or other processing of the individual measured current values may be improved, leading to increased precision in determining the phase currents.

In principle, the method may be employed for any multiphase systems. It is especially suitable for use in the most frequent case in practice, e.g., a three-phase system.

Preferably, the at least two current-measuring devices are constructed from the same components and access the phase current to be measured in each instance in the same manner, so that the phase current to be measured may be determined easily by averaging the measured values obtained for that purpose at the individual current-measuring devices.

To measure the current with the aid of a respective current-measuring device, in particular, a measurement voltage may be processed, which drops at a resistor (located in the current path) assigned to the current-measuring device as a function of the phase current to be measured in each instance. A current measurement by processing a measurement voltage, which drops as a function of the current flowing at the respective output of the converter, at a resistor of the current-measuring device (referred to as shunt resistor or measuring resistor) is described, for example, in German Patent No. 102 37 920 and U.S. Patent Application Publication No. 2006/0164069, each of which is expressly incorporated herein in its entirety by reference thereto.

With the highly precise current measurement, the intention is particularly also to permit very precise ascertainment of what are termed offset and/or gain deviations. An offset error exists when the value measured by a current-measuring device is shifted by a specific amount (offset) compared to the actual current. And a gain deviation exists when the gain factor of a current-measuring device deviates from the setpoint factor.

The current-measuring devices are calibrated in order to take such offset and gain deviations into account. To calibrate a respective current-measuring device, a calibration voltage may be used, that is generated separately from the measurement voltage, which drops at a resistor assigned to the current-measuring device, as a function of the phase current to be measured in each instance. To that end, a respective current-measuring device may be assigned a switchover device, e.g., in the form of switches or in the form of a multiplexer, by which the measurement voltage or the calibration voltage is supplied alternately for processing in the current-measuring device.

A measuring error in the form of an offset error may be determined very easily by setting the calibration voltage to a defined value, especially equal to zero, and then determining whether a resulting voltage produced by processing the calibration voltage in the current-measuring device has a value different from the predefined voltage value, especially different from the voltage value zero. This indicates an offset error, for which compensation must be made accordingly.

To determine a measuring error in the form of what is termed a gain deviation (gain error), e.g., a deviation of the gain factor in a respective current-measuring device from the setpoint factor, advantageously a (defined) calibration voltage having a value unequal to zero is predefined. Particularly if a possible offset error has already been ascertained and compensated for or corrected previously, the actual gain factor may then be determined easily as the quotient of the voltage ascertained at the current-measuring device and the calibration voltage, and thus a deviation from the setpoint value of the gain factor may be ascertained and corrected or compensated for.

It must also be taken into consideration that the offset and gain deviations of a current-measuring device can change with time. Consequently, to compensate for or to correct such errors, it is not sufficient to calibrate a current-measuring device only one time prior to or when putting it into operation. Thus, external influences such as the temperature may lead to a change in offset and gain deviations. It is therefore advisable to calibrate a respective current-measuring device repeatedly (e.g., at certain specifiable times), so that even during measuring operation, an (ongoing, recurrent) compensation or correction of measuring errors, especially offset and gain deviations, is possible at the individual current-measuring devices.

It is possible to calibrate the current-measuring devices in an easy manner during running measuring operations, e.g., especially accompanied by continuous provision of measured values for the individual phase currents at the outputs of the converter. Since at least two current-measuring devices, which determine the phase current independently of each other (in separate channels), are assigned to one respective output of the converter to ascertain the associated phase current, the current-measuring devices assigned to one respective output of the converter to measure the phase current there may be calibrated by turns. That is to say, while one of the current-measuring devices is being calibrated and, for example, is receiving a calibration voltage for that purpose, at least one other current-measuring device assigned to the same output of the converter and therefore to the same phase current, continues to measure the phase current instantaneously present.

The typical duration of a calibration process of the type applicable here is approximately 1 ms. On the other hand, the time interval between successive calibrations so as to be able to take changes in external influences such as the system temperature into account is, for example, on the order of 1 s or more.

The measuring range may be switched over at the individual current-measuring devices, and specifically, between at least two different measuring ranges. In this manner, the signal-to-noise ratio of the current measurement may be further improved.

Thus, in certain practical applications of a converter in which it is used to energize an electric motor, the point is to be able to move objects very quickly on one hand, but on the other hand, to precisely reach a specific setpoint position (end position). For example, this is the case for electric motors which are used in what are referred to as wafer steppers. For the rapid movement of an object with the aid of the converter and the assigned electric motor, large currents must be regulated precisely, while upon reaching the end position, comparatively smaller currents must be adjusted extremely accurately. For that purpose, it may be advantageous to be able to change the measuring range of the current-measuring devices in order to adapt it in targeted fashion to the demands of a specific movement phase.

To that end, it is necessary to be able to switch over the measuring range of a respective current-measuring device during continuous operation, e.g., especially in a manner that it does not lead to an interruption in the measuring of the individual phase currents of the converter. This may be achieved in a manner that, of the at least two current-measuring devices assigned to one respective output of the converter (and therefore to one respective phase current), to in each case switch over the measuring range at only one at a specific instant, while at least one further current-measuring device continues to measure the phase current present at the respective output of the converter.

The switchover of the measuring range of a current-measuring device is initiated by first of all ignoring the measurement data, generated by this current-measuring device, in ascertaining the resulting value for the phase current, and taking only the measured values, specific to that phase current, of the at least one further current-measuring device into account. Thereupon, the measuring range of the first-named current-measuring device is switched over, and there is a wait for the response time. Only then is the measurement data of this current-measuring device also taken into account again in ascertaining the resultant phase current.

If the current-measuring devices are calibrated correctly, the measuring range is switched over without a sudden recognizable change in the measurement data. To that end, it is advantageous to select the reference voltage used in the calibration of the current-measuring device such that it may be used for both measuring ranges. That is, in each case, a respective current-measuring device is calibrated—both upon being put into operation and during measuring operation—using the same reference voltages in the different measuring ranges, especially two measuring ranges. For this purpose, the reference voltage is selected such that, with respect to the comparatively most sensitive (smallest) measuring range, it lies close to its range limits.

After one current-measuring device has been switched over, the measuring range of the at least one further current-measuring device, which is assigned to the same output of the converter and therefore to the corresponding phase current, may then be switched over in corresponding manner.

A device for measuring current at a converter, which in particular is also suitable for performing the method described herein, is described in more detail below.

Further features and aspects of example embodiments of the present invention are described in more detail below with reference to the appended Figures.

DETAILED DESCRIPTION

Figure 1:
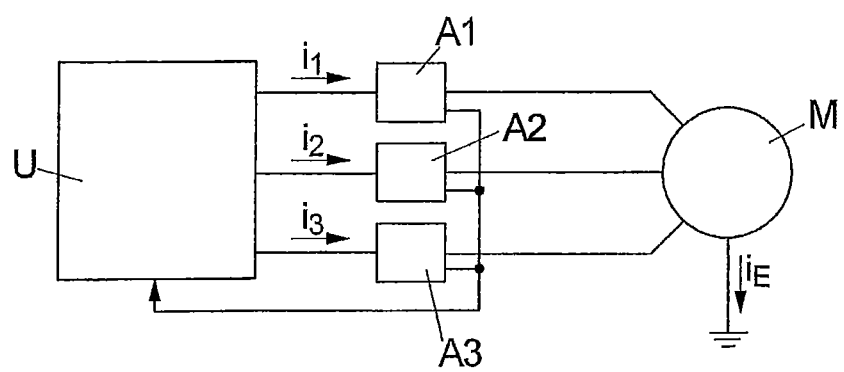
FIG. 1 schematically illustrates a converter having a plurality of outputs for the operation of s motor, at whose outputs, current measurement devices are provided in each case.

FIG. 1 schematically illustrates a converter U which has a plurality of outputs (phase outputs), at which in each case a current $i_1$, $i_2$, $i_3$ (phase current) flows during operation of the converter. The illustrated exemplary embodiment is arranged as a three-phase system having three outputs of converter U and, correspondingly, three output currents or phase currents $i_1$, $i_2$ and $i_3$. Converter U is used for the operation of an electric motor M, to which currents $i_1$, $i_2$, $i_3$ available at the outputs of converter U are supplied.

Also provided at each of the outputs of converter U is a current measurement device $A_1$, $A_2$, $A_3$, by which current $i_1$, $i_2$, $i_3$ present at the respective output is ascertainable. That is, respective current measurement devices $A_1$, $A_2$ and $A_3$ are used in each case for ascertaining current $i_1$, $i_2$ or $i_3$ flowing from the associated output of converter U to electric motor M.

The currents ascertained by the current measurement devices $A_1$, $A_2$ and $A_3$ may be supplied to a closed-loop control device assigned to converter U—in the present exemplary embodiment integrated in converter U, for example—to thereby be able to regulate currents $i_1$, $i_2$ and $i_3$ present at the outputs of converter U. In this context, the sum of the three phase currents $i_1$, $i_2$, $i_3$ should always yield zero, since otherwise, an unwanted current $i_E$ is flowing to ground. This condition may be utilized for detecting error.

Figure 2:
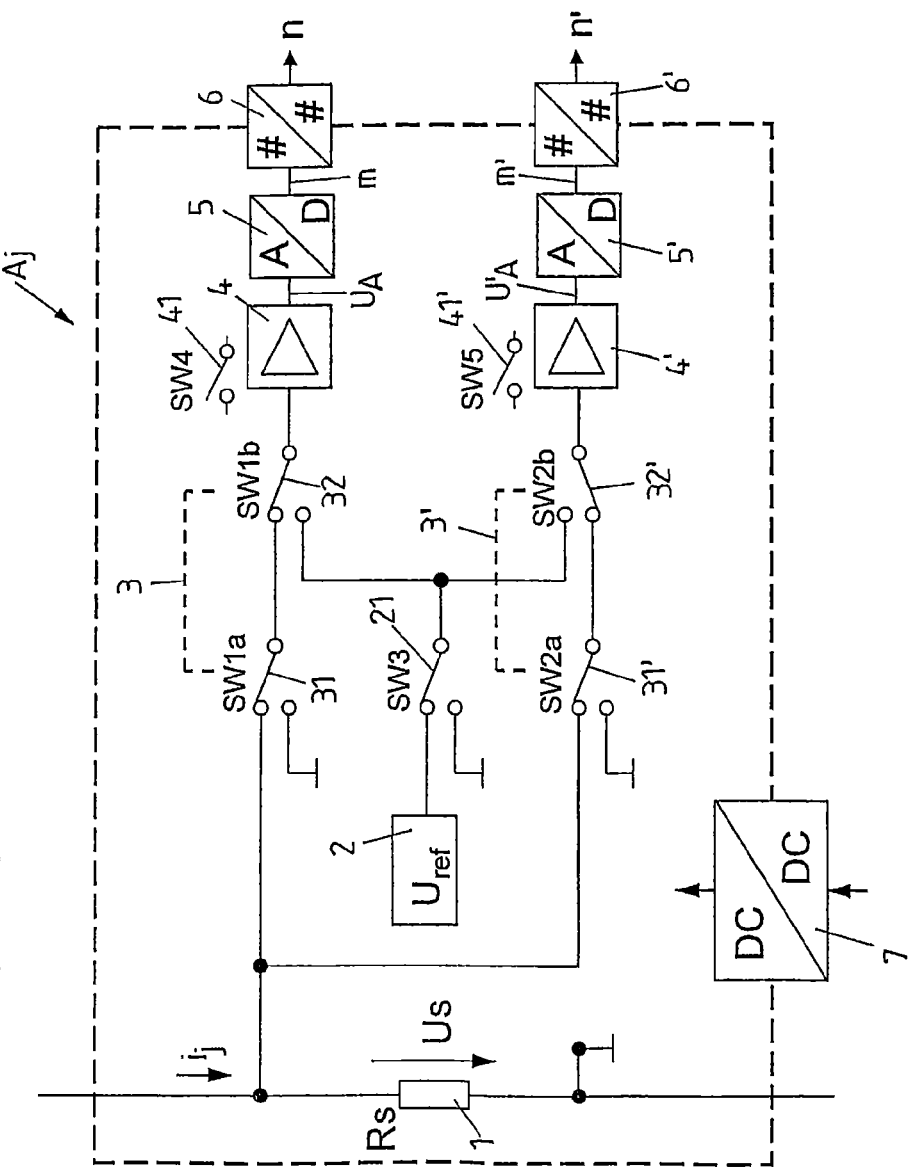
FIG. 2 schematically illustrates a current measurement device.

One possible arrangement of the current measurement device $A_1$, $A_2$ and $A_3$ is shown in FIG. 2 by way of example on the basis of a current measurement device $A_j$ which is used to ascertain phase current $i_j$ at one of the outputs of converter U. The current measurement device $A_j$ includes a resistor 1 (measuring or shunt resistor $R_S$, e.g., having a typical value between 100 µΩ and 100 mΩ), at which a measurement voltage $U_S$, which is a function of current $i_j$ to be measured in each instance, is able to be tapped off. It is amplified by an amplifier 4 and supplied as resultant (analog) voltage value $U_A$ to an analog-to-digital converter 5. Digital voltage signals m present downstream of analog-to-digital converter 5 represent current $i_j$ to be measured (current measurement) as measured values of current-measuring device 4, 5. The principle of such a current-measuring device is described, for example, in German Patent No. 102 37 920 and U.S. Patent Application Publication No. 2006/0164069, each of which is expressly incorporated herein in its entirety by reference thereto.

However, in the present example, device $A_j$ for ascertaining a prevailing phase current $i_j$ are not limited to the measurement of that current $i_j$ by one current-measuring device 4, 5. Rather, a second current-measuring device 4', 5' operating separately is additionally used for that purpose, as well. In the illustrated exemplary embodiment, this additional current-measuring device 4', 5' has the same configuration and is based on components identical to those in the current-measuring device 4, 5.

In the illustrated exemplary embodiment, second current-measuring device 4', 5' for ascertaining voltage $i_j$ likewise taps off measurement voltage $U_S$, dropping at resistor 1, which is then amplified by an amplifier 4' and supplied as resultant (analog) voltage value $U_A'$ to an analog-to-digital converter 5'. Digital measured voltage values m' available downstream of analog-to-digital converter 5' likewise represent current $i_j$ to be measured as measured values of current-measuring device 4', 5'.

The two current-measuring devices 4, 5 and 4', 5', used for determining one and the same phase current are connected to each other in parallel. They access the same measurement voltage $U_S$ of resistor 1, and thus supply two independent measured values $U_A$, $U_A'$ and m, m', respectively, which represent measurement voltage $U_S$ as a function of current $i_j$ to be measured.

By averaging the measuring results obtained by current-measuring devices 4, 5; 4', 5', a resultant value may be ascertained for current $i_j$, and specifically, having an improved signal-to-noise ratio compared to the determination of current $i_j$ using only one current-measuring device 4, 5.

The potential of current-measuring devices 4, 5; 4', 5' is specific to resistor 1. In order to overcome the potential difference with respect to a downstream control circuit via which a motor is to be operated with the aid of converter U, for example, and whose potential is normally specific to the potential to ground, signal couplers 6, 6' and DC/DC converter 7 may be used. Suitably corrected (digital) output values n, n' of current-measuring devices 4, 5; 4', 5' specific to potential to ground may thereby be generated.

In summary, respective device $A_j$ for determining phase current $i_j$ at an output of converter U in each case has two current-measuring devices 4, 5; 4', 5' which measure current $i_j$ independently of each other, e.g., by processing the same measurement voltage $U_S$, which is a function of current $i_j$ to be measured. A resulting value of current $i_j$ may then be ascertained from the measured values of both current-measuring devices 4, 5; 4', 5' by averaging.

During operation of such current measurement devices, (systematical) measuring errors may occur, for example, because the gain factor α(t) and the offset β(t) in respective current-measuring device 4, 5; 4', 5' change over time. The measured-value deviations to be compensated for or corrected by calibration come about especially in the measuring chain from resistor 1 via respective amplifier 4, 4' to digital-to-analog converter 5, 5'. They are predominantly offset and gain deviations of respective amplifier 4, 4' as well as of respective analog-to-digital converter 5, 5'.

In this context, the following relationship is satisfied:

$$U_A = U_S \cdot \alpha(t) + \beta(t).$$

Thus, it is necessary to calibrate current-measuring devices 4, 5; 4', 5' (at regular intervals), so as to be able to compensate for or correct measuring errors in the form of measured-value deviations (changeable over time) from the true values (for the currents to be measured). For the calibration, upstream of amplifier 4 and 4' of a respective current-measuring device 4, 5; 4', 5; are switchover devices 3, 3', via which measurement voltage $U_S$, tapped off at resistor 1, or a calibration voltage $U_K$ may be supplied alternately to the amplifier, in order from that to initially generate a voltage $U_A$ and $U_A'$, respectively, by amplification, and subsequently to generate corresponding digital measured value m and m', respectively.

In the present example, each switchover device 3, 3' includes two switches 31, 32 or 31', 32', as a function of whose switching position, either measurement voltage $U_S$ or a calibration voltage $U_K$ is applied to amplifier 4, 4' of respective current-measuring device 4, 5 or 4', 5'. In principle, a single switch 32 or 32' of respective switchover devices 3, 3' would be sufficient for the switchover. However, by the series connection of two switches 31, 32 or 31', 32' in respective switchover device 3, 3', a signal penetration or feedthrough may be reduced considerably, which is advantageous for a precision measurement.

With the aid of a further switch 21, calibration voltage $U_K$ may be set either via a calibration source 2 to a reference value $U_{ref}$ or to ground and therefore the value 0V.

The calibration of current-measuring devices 4, 5; 4', 5' is described in the following, for example, based on the one current-measuring device 4, 5 (in order to simplify the description). However, it holds true in the same manner for the other current-measuring device 4', 5'. For that, it is only necessary to add a prime in each case to the reference symbols and measured values in the following observations.

To determine a measured-value deviation in the form of an offset, a calibration voltage $U_K$ having a specific pre-definable value, e.g., having the value $U_K$=0V, is produced with the aid of calibration source 2. This calibration voltage $U_K$ (e.g., having the value 0V) is transmitted (instead of measurement voltage $U_S$) via switchover device 3, 21 to the input of amplifier 4.

From the relationship $U_A = U_K \cdot \alpha(t) + \beta(t)$ above, it follows for the case $$U_K = 0$$

that:

$$U_A = \beta(t).$$

Thus, the instantaneous (in general time-dependent) value of offset β(t) is ascertained as (analog) voltage signal $U_A$ presently available at the output of amplifier V, or as corresponding digital value m.

This permits a compensation or correction of offset errors, by subtracting previously ascertained offset β(t) from voltage value $U_A$ ascertained in each case at corresponding current-measuring device 4, 5 during the current measurement. There is then no longer a relevant offset in voltage value $U_A$ present downstream of amplifier V, so that $U_A$ is represented as $$U_A = U_K \cdot \alpha(t).$$

If a calibration voltage $U_K$ having a reference value $U_{ref}$ different from zero ($U_K = U_{ref}$) is utilized in a further (second) measurement, then:

$$U_A = U_{ref} \cdot \alpha(t).$$

From this, the instantaneous value of gain factor α(t) may be determined immediately as $$\alpha(t) = \frac{U_A}{U_{ref}}.$$

Thus, in the calibration operation of a current-measuring device Aj using, in each instance, a defined calibration voltage $U_K$, which, for example, is set to be equal to zero for the first measurement and is set to a value $U_{ref}$ different from zero for the second measurement, time-dependent offset β(t) as well as the time-dependent deviation of gain factor α(t) are able to be determined with only two measurements, and subsequently taken into account, e.g., compensated for or corrected, in ascertaining (analog) measured voltage values $U_A$ or corresponding digital values n.

The use of two independent (parallel-connected) current-measuring devices 4, 5; 4', 5' to ascertain a prevailing phase current $i_j$ at the outputs of converter U permits problem-free calibration of the current-measuring devices not only prior to or upon start-up, but especially also during running measuring operation, and in fact, without its interruption. This is important, because a one-time compensation or correction of offset and gain deviations prior to putting the system into operation is not sufficient, at any rate when highly precise current measurements are required. The reason is that the offset and gain deviations can change with time, for example, as a function of changing ambient conditions such as the temperature. Therefore, a recurring recalibration of the current-measuring devices is advantageous, especially at predefined time intervals, for instance, in the range of 1 s.

In the present example, a respective current-measuring device 4, 5 or 4', 5' may be calibrated in easy manner during ongoing measuring operation by in each instance calibrating alternatingly only one of the two current-measuring devices 4, 5 or 4', 5', which are used for measuring the same phase current $i_j$. That is, while the one current-measuring device 4, 5 is being calibrated, the other current-measuring device 4', 5' continues to measure current $i_j$ and vice versa. Only an averaging of the measuring results cannot be carried out during the calibration.

The duration of a calibration process is typically less than 1 ms. This is three orders of magnitude less than an expedient time interval between successive calibrations, which is at approximately 1 s. Therefore, the calibration of one of the two current-measuring devices 4, 5; 4', 5' during measuring operation is an exception (viewed timewise). Far overwhelmingly, both current-measuring devices 4, 5; 4', 5' are available to determine a prevailing phase current $i_j$ by averaging based on the measured values of both current-measuring devices 4, 5 and 4', 5'.

Current may thus be measured even while one respective current-measuring device 4, 5 or 4', 5' is being calibrated. Only the averaging based on two measurement results, associated with a further improvement in the signal-to-noise ratio, is inapplicable.

Furthermore, in the case of the exemplary embodiment illustrated in FIG. 2, a switchover is provided between different measuring ranges of a respective current-measuring device 4, 5 or 4', 5', e.g., specifically between two measuring ranges in the present example. This switchover possibility serves to further improve the signal-to-noise ratio during the current measurement. Thus, the use of different measuring ranges for the current measurement may be expedient when converter U, at whose outputs the individual phase currents are to be measured, drives an electric motor with which certain objects are intended to be moved quickly, on one hand, and on the other hand, are to be conveyed precisely into specific end positions. While the requirement of a control of large currents is associated with the rapid movement of the objects, a highly accurate setting of comparatively small currents is necessary to precisely reach predefined end positions. By switching over between measuring ranges, the current-measuring devices are able to be adapted to such different demands.

To switch over the measuring range of a respective current-measuring device 4, 5; 4', 5', in the present example, amplifier 4 or 4' of the respective current-measuring device is assigned a switch 41 or 41', with which its gain, and therefore, as a result, the measuring range of respective current-measuring device 4, 5 or 4', 5' may be switched over.

Figure 3:
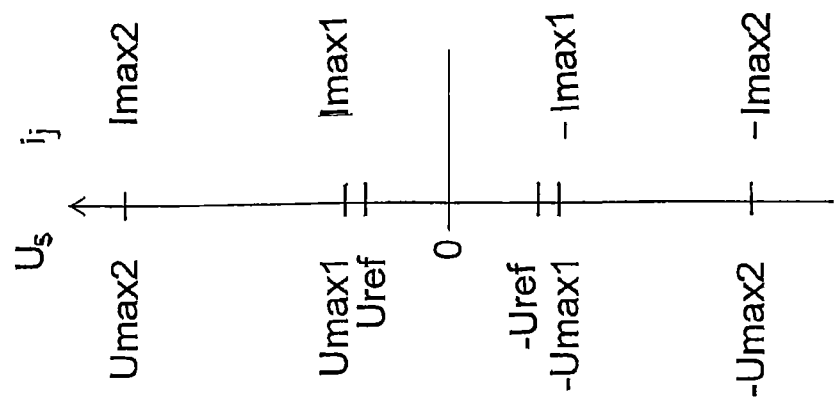
FIG. 3 schematically illustrates different measuring ranges of the current measurement device.

Two different measuring ranges of a current-measuring device are illustrated schematically in FIG. 3, e.g., both with regard to measured voltage U and with regard to corresponding current I. In the first smaller measuring range, voltage values between $U_{max1}$ and $-U_{max1}$ and corresponding current values between $I_{max1}$ and $-I_{max1}$ are detectable. In the second larger measuring range, the voltage values lie between $U_{max2}$ and $-U_{max2}$ or $I_{max2}$ and $-I_{max2}$.

According to one specific example, for instance, it is possible that the value of $I_{max1}$=5.3 A and the value of $I_{max2}$=38 A. This corresponds to voltages of 53 mV and 380 mV, respectively, given a resistance R of 10 mΩ.

The arrangement illustrated in FIG. 2 permits a switchover between different measuring ranges not only prior to or upon putting the system into operation, but also during ongoing measuring operation, and in fact, without interrupting the measuring of current. To that end, when switching over the measuring range of one of the two current-measuring devices 4, 5 or 4', 5', the procedure is as follows:

First of all, the data of the current-measuring device to be switched over (e.g., 4, 5) is ignored in ascertaining the resultant current, e.g., the resultant current is no longer ascertained by averaging the measured values of both current-measuring devices 4, 5 and 4', 5', but rather, only the measured values of the current-measuring device presently not to be switched over (e.g., 4', 5') are utilized. Then, in the case of the current-measuring device to be adjusted in terms of the measuring range, the gain is switched (by switch 41 provided for that purpose) and there is a wait for the response time. Only then are the measured values of current-measuring device (4, 5) just now switched over utilized again for ascertaining the resultant phase current.

Subsequently, the measuring range of the other current-measuring device 4', 5' may be switched over, while the one current-measuring device 4, 5 continues to supply measured values for the phase current to be ascertained.

If, in calibrating the current-measuring devices, a reference voltage $U_{ref}$ is used which is valid for both measuring ranges, e.g., lies within the first smaller measuring range, then no sudden change comes about in the measurement data in response to the switchover of the measuring range of a respective current-measuring device 4, 5 or 4', 5' (although a switchover of the gain of a respective current-measuring device 4, 5 or 4', 5' leads to a different offset-shift).

As soon as both current-measuring devices 4, 5 and 4', 5' have been switched over to the desired new measuring range, the measured current values of both current-measuring devices 4, 5 and 4', 5' are again averaged to determine the resultant phase current.

Figure 4:
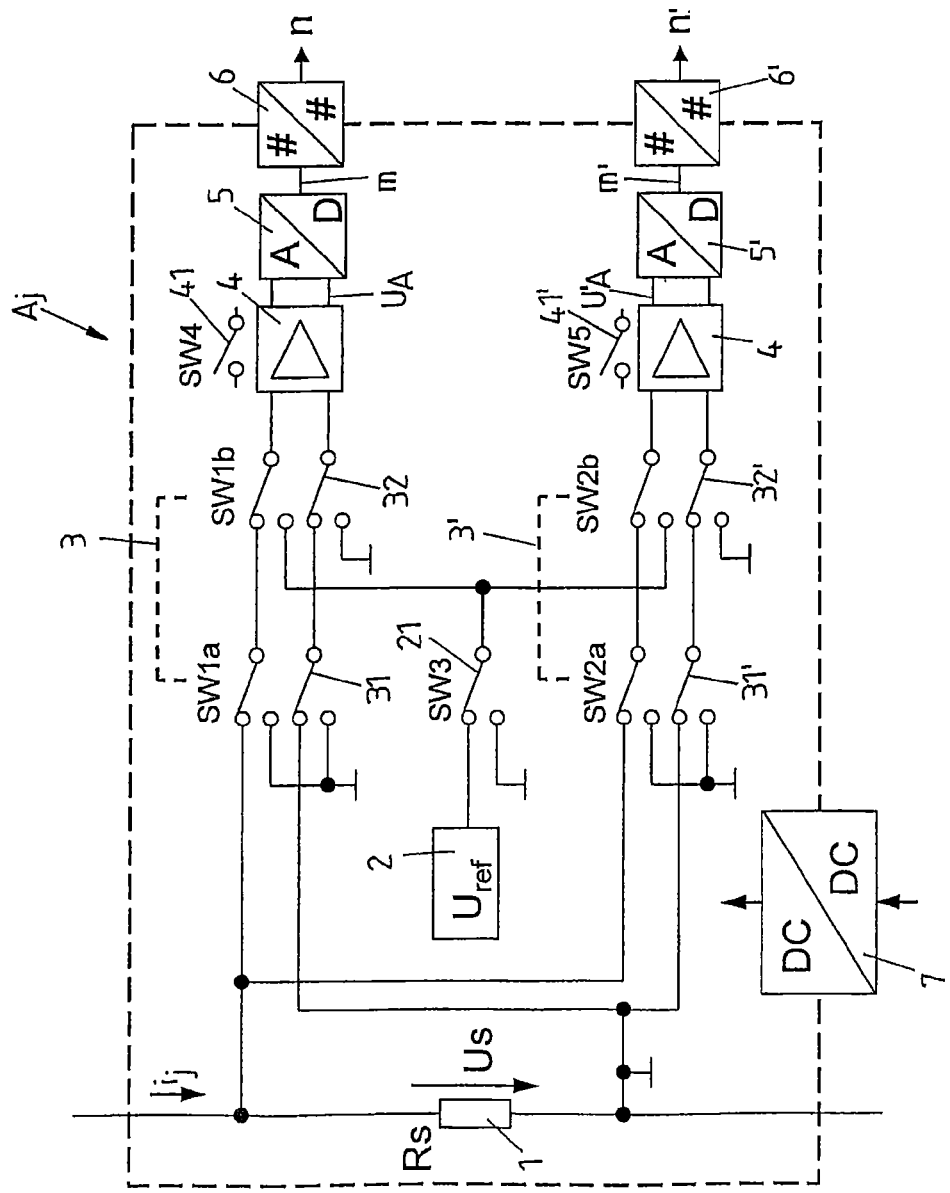
FIG. 4 schematically illustrates a modification of the arrangement illustrated in FIG. 2.

A measuring error may come about in the case of a very precise current measurement, because the reference potential is not exactly the same everywhere in the circuit. That is why a differential measurement may be necessary, because the reference potential plays no role for a differential voltage. Therefore, FIG. 4 illustrates a modification of the exemplary embodiment illustrated FIG. 2. The difference lies in the fact that the arrangement illustrated in FIG. 4 operates on the basis of a differential signal routing. That is, in contrast to the arrangement illustrated in FIG. 2, current-measuring devices 4, 5 and 4', 5' tap off not simply voltage $U_S$ dropping at resistor 1, but rather a differential of this voltage, as illustrated in FIG. 4. Switchover devices 3, 3' and current-measuring devices 4, 5 and 4', 5' are adapted to this differential signal routing. In all other respects, the arrangement illustrated in FIG. 4 matches the arrangement illustrated in FIG. 2.

What is claimed is:

1. A method for measuring current at a converter in order to supply the measuring current to a closed-loop control device assigned to the converter, the converter having a plurality of phase outputs, comprising:
    independently and simultaneously measuring a prevailing phase current at a common phase output of the converter by at least two current-measurement devices, each current-measurement device adapted to measure electrical current in at least two predefined current-measurement ranges, utilizing results of measuring of both current-measurement devices to determine the prevailing phase current, wherein a measuring range of each of the current-measurement devices is adjustable during measuring operation by switching the measuring range between the at least two predefined current-measurement ranges; and
    repeatedly switching between the predefined current-measurement ranges of the current-measurement devices that measure the phase current at the common phase output of the converter, so that while the measuring range of one current-measurement device is being switched over, at least one other current-measurement device continues to measure the phase current.

2. The method according to claim 1, wherein the current-measurement devices, at which in each case a common phase current is measured, are connected in parallel to each other.

3. The method according to claim 1, further comprising averaging the measured values of the current-measurement devices to determine a resultant value of the phase current.

4. The method according to claim 1, wherein the measuring includes processing a measurement voltage, which drops at a resistor, assigned to the current-measurement device, as a function of the phase current.

5. The method according to claim 1, further comprising repeatedly calibrating the current-measurement devices during operation of the converter.

6. The method according to claim 5, wherein to correct measuring errors, the current-measurement devices are calibrated individually, while at least one further current-measurement device used for measuring the phase current is in measuring operation.

7. The method according to claim 5, wherein the calibrating includes correcting an offset shift and/or a gain error of the current-measurement device as a measuring error.

8. The method according to claim 5, further comprising deactivating the current-measurement device for current measurement during calibration, the deactivated current-measurement device ascertaining no measured values of the phase current.

9. The method according to claim 4, further comprising processing a calibration voltage that is generated separately from the measurement voltage.

10. The method according to claim 9, further comprising alternatingly supplying, by a switchover device assigned to the current-measurement device, the measurement voltage and the calibration voltage for processing in the current-measurement device.

11. The method according to claim 9, wherein in calibrating the current-measurement devices, a reference voltage is used as the calibration voltage, which lies within all measuring ranges for the current-measurement devices.

12. A device for measuring current at a converter in order to operate a closed-loop control device, assigned to the converter, based on measured phase currents, comprising:
    at least two current-measurement devices, connected downstream of a respective common phase output of the converter, adapted to simultaneously measure associated phase current independently of each other, so that the measuring results of both current-measurement devices are utilized to determine the prevailing phase current;
    wherein each current measurement device is adapted to measure electrical current in at least two predefined current-measurement ranges;
    wherein a measuring range of each of the current-measurement devices is adjustable during measuring operation by switching the measuring range between the at least two predefined current-measurement ranges; and
    and wherein the current-measuring devices that measure the phase current at the common phase output of the converter are adapted to repeatedly switch between the predefined current-measurement ranges, so that while the measuring range of one current-measurement device is being switched over, at least one other current-measurement device continues to measure the phase current.

13. The device according to claim 12, wherein the current-measurement devices at each output of the converter are connected to each other in parallel.

14. The device according to claim 12, wherein the device is adapted to perform the method according to claim 1.

* * * * *